(12) United States Patent
Chih et al.

(10) Patent No.: US 6,906,958 B2
(45) Date of Patent: Jun. 14, 2005

(54) WORD-LINE VOLTAGE GENERATOR

(75) Inventors: Yue-Der Chih, Hsinchu (TW);
Cheng-Hsiung Kuo, Tainan (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 220 days.

(21) Appl. No.: 10/397,574

(22) Filed: Mar. 26, 2003

(65) Prior Publication Data

US 2004/0190340 A1 Sep. 30, 2004

(51) Int. Cl.[7] ................................................. G11C 16/06
(52) U.S. Cl. ............................. 365/185.23; 365/185.2; 365/189.09
(58) Field of Search .................... 365/185.23, 185.2, 365/185.21, 189.07, 189.09

(56) References Cited

U.S. PATENT DOCUMENTS

| | | | |
|---|---|---|---|
| 4,698,787 A | 10/1987 | Mukheree et al. | |
| 4,868,619 A | 9/1989 | Mukheree et al. | |
| 5,045,488 A | 9/1991 | Yeh | |
| 5,242,848 A | 9/1993 | Yeh | |
| 5,278,087 A | 1/1994 | Jenq | |
| 5,386,158 A | 1/1995 | Wang | |
| 5,475,634 A | 12/1995 | Wang et al. | |
| 5,572,054 A | 11/1996 | Wang et al. | |
| 5,687,114 A | 11/1997 | Khan | |
| 5,754,475 A * | 5/1998 | Bill et al. | 365/185.25 |
| 5,858,577 A | 1/1999 | Lee et al. | |
| 5,910,914 A | 6/1999 | Wang | |
| 6,097,636 A | 8/2000 | Nojima | |
| 6,181,599 B1 * | 1/2001 | Gongwer | 365/185.18 |
| 6,222,765 B1 | 4/2001 | Nojima | |
| 6,285,598 B1 | 9/2001 | Khan et al. | |
| 6,329,685 B1 | 12/2001 | Lee | |
| 6,839,280 B1 * | 1/2005 | Chindalore et al. | 365/185.2 |
| 2001/0050863 A1 | 12/2001 | Khan et al. | |

OTHER PUBLICATIONS

"Semiconductor Memories,"*Digital Integrated Circuits*, © Prentice Hall 1995.

* cited by examiner

*Primary Examiner*—Gene N. Auduong
(74) *Attorney, Agent, or Firm*—Duane Morris LLP

(57) ABSTRACT

A programmable memory circuit includes a memory array having a plurality of floating gate memory cells disposed in a first and second row and at least a first and second column and a reference circuit for providing a word line voltage to the memory array for programming selected memory cells from a selected one of the first and second rows. The word line voltage is dependent at least in part upon a bit line reference voltage and upon a threshold voltage of a reference floating gate cell associated with the selected one of the first and second rows.

19 Claims, 2 Drawing Sheets

WORD-LINE VOLTAGE GENERATOR

FIELD OF THE INVENTION

The present invention relates to floating gate memory arrays, and more particularly to reference circuits for programming floating gate memory arrays.

BACKGROUND OF THE INVENTION

FIG. 1 is a circuit diagram of a prior art memory circuit 10. The memory circuit 10 includes a memory array 12 including even and odd rows of floating gate memory cells M4, M6, M8, M10 and M5, M7, M9 and M11, respectively. Switches S2 and S3 select the even and odd rows, respectively, for programming. Each source node of the memory cells is coupled to a source line (SL) to receive a source line voltage during programming, such as 10 V for 0.25 μm memory cells. Bit lines BL0–BL3 are coupled to drain terminals of the transistors of the even and odd row memory cells to provide bit line voltages during programming.

The memory circuit 10 also includes a reference circuit 14 for programming the memory cells M4–M11 of memory array 12. The gate of PMOS transistor M1 is connected to a voltage source Vbias to generate current Ibias. The source, gate and floating gate of each reference cell M2 and M3 are shorted together. When switch S0 is closed, M2 connects to resistor R1. When switch S1 is closed, M3 connects to resistor R1. The node voltage VPWL, which is the word line voltage for programming cells in memory array 12, is determined by the voltage drop across M2 (or M3) and R1 according to the following: VPWL=Vgd(M2)+Ibias×R1 if S0 is on and Vgd(M3)+Ibias×R1 if S1 is on.

The reference circuit 14 of FIG. 1 is utilized in the 0.25 μm technology generation. The circuit generally exhibits good performance, but requires a special floating gate contact 16, which cannot be used with technology generations that utilize self-aligned processes that do not use a mask to define the floating gate (e.g., 0.18 μm generations). The circuit 10 also does not use a common voltage source for the source node of the reference cells of the reference circuit 14 and the source node of the selected memory cells of the memory array 12. The reference cells, therefore, do not exactly track the memory cells, i.e., the programming bias conditions (WL, BL and SL voltages and programming current) of the reference cells are not the same as the memory cells. Consequently, the reference cells cannot completely control memory cell behavior during programming.

FIG. 2 is a circuit diagram of a second prior art memory circuit 20. The memory circuit 20 includes a fixed reference voltage generator circuit 22 that provides a fixed word line voltage to memory array 12. While the voltage circuit 22 does not require a special floating gate contact, the circuit 20 is susceptible to process variations, such as misalignment of polysilicon control gates with the floating gates, and can exhibit a degradation in program efficiency and program disturb immunity therewith. When the threshold voltage of a neighboring cell in the selected bit line is lowers than a memory cell that is to be programmed in the bit line, "punch through" can be made worse, i.e., there may be hot electrons available to program an inhibited, erased cell from the unselected word line. Similarly, when the threshold voltage of a selected cell is higher than the neighboring cell in the same word line, there may be hot electrons available to program the inhibited, erased cell from the neighboring, unselected bit line (referred to as program-ff disturb).

Therefore, there remains a need for a reference circuit scheme that tracks process variations and programming conditions while being compatible with lower feature size processes.

SUMMARY OF THE INVENTION

A programmable memory circuit includes a memory array having a plurality of floating gate memory cells disposed in a first and second row and at least a first and second column and a reference circuit for providing a word line voltage to the memory array for programming selected memory cells from a selected one of the first and second rows. The word line voltage is dependent at least in part upon a bit line reference voltage and upon a threshold voltage of a reference floating gate cell associated with the selected one of the first and second rows.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 3:
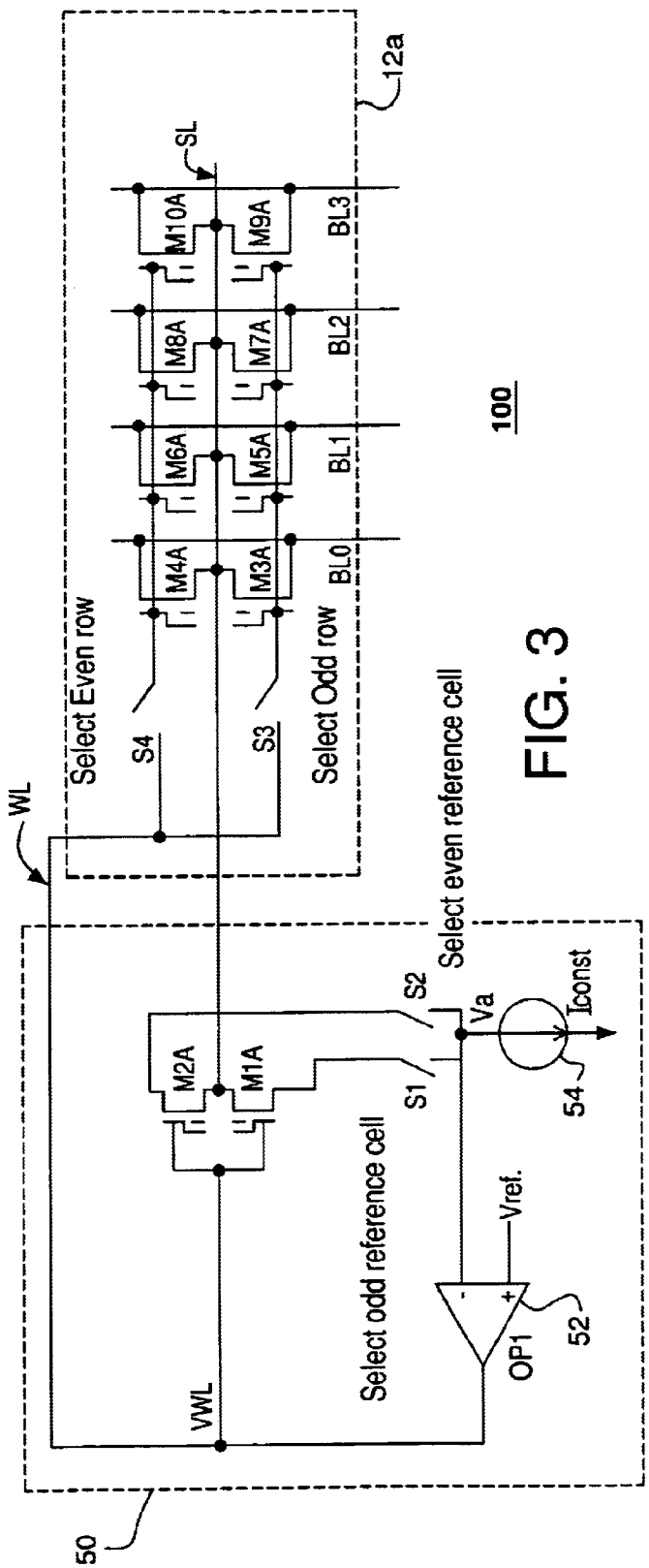
FIG. 3 is a circuit diagram of an exemplary memory circuit including a floating gate memory array and programming reference circuit.

FIG. 3 is a circuit diagram of an exemplary memory circuit 100. The memory circuit 100 includes a memory array 12a similar to that described above in connection with prior art FIGS. 1 and 2. The memory array 12a includes a plurality of memory cells disposed in two rows and at least two columns. The even row of memory cells, which includes floating gate MOS transistors M4A, M6A, M8A and M10A, is selected with switch S4. The odd row of memory cells is selected with switch S3 and includes floating gate MOS transistors M3A, M5A, M7A and M9A: The source terminals of the transistors M3A–M10A are coupled to a source line (SL), which provides a source line voltage (VSL) during programming. The drain terminals of the transistors in each column of array 12a are coupled to a respective bit line BL0, BL1, BL2 or BL3, which provides an appropriate bit line voltage (VBL) to a column of cells during programming thereof. For memory arrays including memory cells having 0.25 μm transistors, the bit line programming voltage is typically around 0.8V. For memory arrays including memory cells having 0.18 μm transistors, the bit line programming voltage is typically around 0.3V.

A reference circuit 50 is coupled to the memory array 12a through switches S4 and S3 for providing the word line voltage (VWL) on word line (WL) for programming memory cells in array 12a. The reference circuit 50 includes reference cells including two floating gate transistors M2A and M1A coupled together at their respective source terminals. The source terminals of the reference cells are also coupled to the source terminals of the transistors of memory array 12a to receive common source line voltage VSL. Therefore, the source nodes of the reference and memory cells have the same source potential at program cycle—approximately 10V for 0.25 μm cells and 7.5V for 0.18 μm cells. The bias terminals, i.e., the control gates of transistors M1A and M2A, are coupled to the output of a comparator, shown as operational amplifier 52, to receive word line voltage VWL. The comparator output is also selectively coupled to the bias terminals of the memory cells of the even and odds rows of memory array 12a through switches S4 and S3, respectively.

The drain terminals of the floating gate reference cells M1A and M2A are coupled through switches S1 and S2, respectively, to a constant current source 54, which provides constant current Iconst, and to the negative (−) input of operational amplifier 52. The voltage at this node is labeled as "Va". The second input terminal of operational amplifier 52, e.g., the positive (+) input terminal, is coupled to a reference voltage Vref. Vref should be set to the desired bit line programming voltage for the memory array 12a, e.g., approximately 0.8V for 0.25 μm cells and 0.3V for 0.18 μm cells. The operation of reference circuit 50 is described hereafter.

The conditions for programming a cell in memory array 12a are as follows: VWL>Vt(memory cell); VBL: between 0–1.0V; and VSL: high voltage. As mentioned, the programming conditions differ for each technology generation (e.g., between 0.25 μm and 0.18 μm transistor cells). For example, exemplary programming conditions for the 0.25 μm generation are approximately as follows: VWL: 1.8V, VBL: 0.8V and VSL: 10V. The programming conditions for the 0.18 μm generation are as follows: VWL: 1.2V, VBL: 0.3V and VSL: 7.5V. Basically, when a memory cell is programmed, electrons are injected onto the floating gate because the transistor is "on" and the source to drain voltage differential is large enough to generate channel hot electrons. The programming effect is eventually self limiting as negative charge accumulates on the floating gate. After programming is over, the floating gate is filled with electrons. In split-gate Flash cells, a "1" (erased cell) is represented by a low Vt level of the transistor cell and a "0" (programmed state) is represented by a high Vt level of the transistor cell. The low Vt voltage is a function of the WL voltage, but the high Vt level is a function of the SL voltage.

Transistors M1A and M2A are reference cells that are used in the generation of word line programming voltage VWL for memory cells in the memory array 12A. Switches S1 and S2 are used to select odd reference cell M1A or even reference cells M2A. Switches S1, S2, S3 and S4 are typically triggered by the lowest significant bit of an address—Xadr<0>—received by a decoder. These switches may be NMOS or PMOS transistors, for example. Odd reference cell M1A is associated with the odd row of memory cells in the array 12a, and even reference cell M2A is associated with the even row of memory cells in the array 12a. These reference cells are fabricated along the same row in an integrated circuit, so as to share common process variations with their respective associated row of memory cells and common threshold voltage Vt both before and after programming. Iconst is a programming current for the reference cells (i.e., the current for channel hot electron injection) that provides a constant current to M1A when S1 is selected or M2A when S2 is selected.

At program cycle, Va is forced to Vref due to the virtual ground of the operational amplifier 52. Since the bit line voltage Va and the source line voltage VSL of the selected reference cell are forced to a selected voltage level, respectively, and a constant bias current Iconst is provided to the reference cell, the word line voltage VWL is automatically set to a proper voltage level for programming the memory cells, i.e., a voltage level that is dependent upon and tracks the reference cell threshold voltage Vt of the selected reference cell and, therefore, the memory cell threshold voltage Vt of the memory cells in the selected row. Word line voltage VWL is automatically set to the sum of the threshold voltage Vt of the selected reference cell and the bit line voltage Va, which is forced to Vref. This is important because the cell Vt of even and odd reference cells may differ due to misalignment of the control gates or other process variations, and Vt of the reference cell of a selected row is equal to Vt of the memory cells of the selected row. This operation of the reference circuit 50 is explained hereafter in more detail.

Assume initially that VWL at the output of comparator 52 is 0V, resulting in each reference cell being off. There is no current provided by a selected reference cell, which is selected by switch S1 or S2, so Va is pulled down by constant current source 54. When Va is less than Vref (Va<Vref), operational amplifier 52 outputs a positive voltage. The positive voltage turns on the selected reference cell M1A or M2A when it exceeds Vt of the selected reference cell. If the current generated by the selected reference cell is still too small to pull up Va, the word line voltage VWL outputted by the comparator 52 increases. The comparator output voltage continues to rise until VWL is high enough to provide sufficient current to overcome the pull-down capability of constant current source 54. If VWL becomes too high such that the selected reference cell provides too much current, Va is pulled higher until it exceeds Vref (Va>Vret). When Va is greater than Vref, the operational amplifier 52 outputs a ground voltage, turning off the selected reference cell. Va then decreases due to Iconst. Va decreases until Va equals Vref. As soon as Va is less than Vref, the comparator 52 outputs a positive voltage to turn on the reference cell. Eventually, the reference circuit 50 settles such that VWL= Vt (of the selected reference cell)+Va (which is forced to Vref). The word line voltage, therefore, tracks any process variations affecting the threshold voltage of the selected row of cells and is dependent in part on the selected bit line reference voltage Vref.

Figure 4:
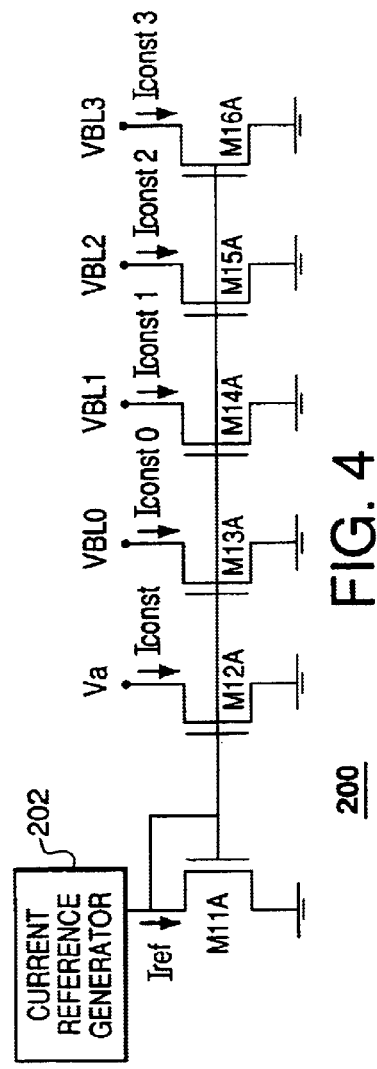
FIG. 4 is a circuit diagram of a current mirror structure for providing a constant programming current for the reference and memory cells in the memory circuit of FIG. 3.

In an exemplary embodiment, BL0–BL3 are also connected to a constant current source having the same current level as Iconst during programming, i.e., Iconst0–Iconst3. This may be accomplished by using a current mirror 200 as shown in FIG. 4. Current mirror 200 includes a current reference generator 202, the details of which should be familiar to those in the art and are not repeated herein, that generates a reference current Iref to transistor M11A of circuit 200 that is mirrored through transistors M12A–M16A of circuit 200 to provide currents Iconst and Iconst0 through Iconst 3.

The above-described memory circuit 100 provides excellent process tracking between the reference circuit 50 and the programmed memory array 12a. Put another way, the bias conditions (e.g., source, word and bit line voltages and programming current) for the reference cells and the cells of the memory array 12a are the same. This is not the case with prior art memory circuits such as circuit 10 of FIG. 1, which does not allow for full control of memory cell behavior due to the different source node voltages for the reference and memory cells. Also, no floating gate contact is needed to connect the control gate to the floating gate of each reference transistor.

Figures 1, 2:
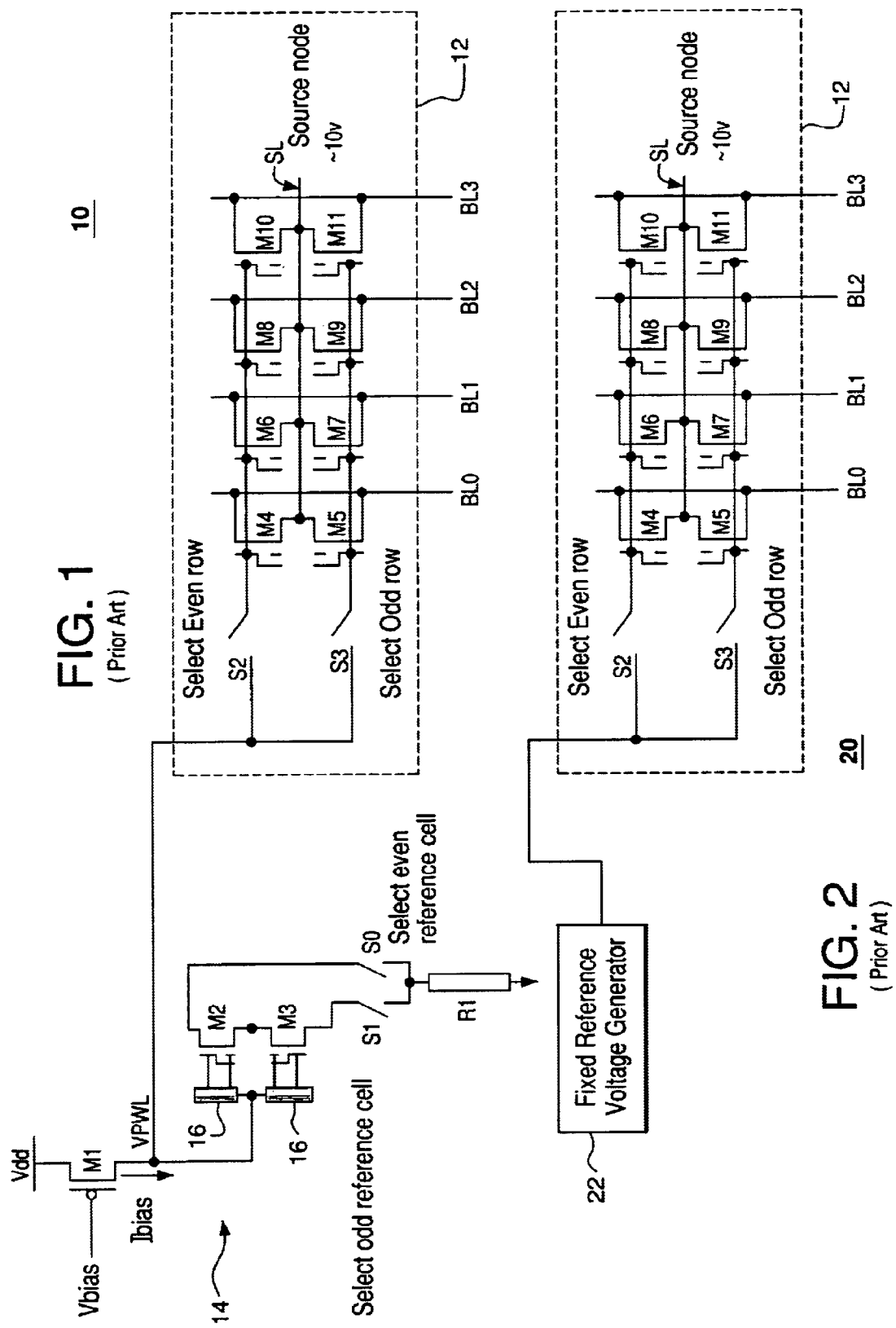
FIG. 1 is a circuit diagram of a first prior art memory circuit.
FIG. 2 is a circuit diagram of a second prior art memory circuit.

The circuit design 100 also provides for excellent program efficiency and program disturb immunity because the word line voltage tracks the cell threshold voltages, particularly when compared with prior art memory circuit 20 of FIG. 2. Program efficiency is generally defined by the following equation: program efficiency=(Ir1−Ir0)/t where "Ir1" is the cell current in the erased state, "Ir0" is the cell current of the programmed state, and "t" is the programming time. In circuit 20, the BL voltage cannot be made too low in order to prevent punch through programming to a neighboring cell in the unselected word line. This reduces program performance due to the smaller voltage difference between the source and drain and the fixed WL voltage. In the memory circuit 100 of FIG. 3, the memory cell WL voltage is automatically determined by the reference circuit 50 and the BL voltage is controllable through Vref, allowing a choice of a suitable reference voltage to prevent program disturb and get better program efficiency.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A programmable memory circuit, comprising:
   a memory array having a plurality of floating gate memory cells disposed in a first and second row and at least a first and second column; and
   a reference circuit for providing a word line voltage to said memory array for programming selected memory cells from a selected one of said first and second rows, said word line voltage being dependent at least in part upon a bit line reference voltage and upon a threshold voltage of a reference floating gate cell associated with said selected one of said first and second rows.

2. The memory circuit of claim 1, wherein said reference circuit includes a first and second reference floating gate cell associated with said first and second rows, respectively, wherein source terminals of said reference cells are coupled to source terminals of said memory cells to receive a common source line voltage during programming of said memory cells.

3. The memory circuit of claim 2, wherein said reference circuit comprises the following:
   a comparator having an output coupled to bias terminals of said memory cells in said memory array to provide said word line voltage.

4. The memory circuit of claim 3, wherein said comparator output is coupled to bias terminals of said reference cells and said reference circuit includes switching means for selectively coupling respective drain terminals of said reference cells to a first input of said comparator.

5. The memory circuit of claim 4, wherein said bit line reference voltage is a constant bit line voltage selected for programming cells of said memory array.

6. The memory circuit of claim 5, wherein said bit line reference voltage is coupled to a second input of said comparator as a reference voltage.

7. The memory circuit of claim 6, further comprising a constant current source coupled to said first input and selectively coupled to said drain terminals through said switching means for providing a programming current for said reference cells.

8. The memory circuit of claim 7, further comprising a current mirror circuit configured to provide said programming current to selected bit lines of said memory array during programming of memory cells in said memory array.

9. The memory circuit of claim 6, wherein said comparator is an operational amplifier.

10. An integrated circuit including a memory circuit, comprising:
    a memory array having a plurality of floating gate memory cells disposed in a first and second row and at least a first and second column; and
    a reference circuit, said reference circuit comprising a first and second reference floating gate cell associated with said first and second rows, respectively, and a comparator having an output coupled to bias terminals of said reference cells and selectively coupled to bias terminals of said memory cells, said comparator providing a word line voltage for programming selected memory cells from a selected one of said first and second rows dependent at least in part upon a bit line reference voltage and upon a threshold voltage of a respective reference cell associated with said selected one of said first and second rows.

11. The integrated circuit of claim 10, wherein said comparator has a first input selectively coupled to respective drain terminals of said first and second reference cells and a second input coupled to said bit line reference voltage.

12. The integrated circuit of claim 11, wherein said reference circuit further comprises a constant programming current source coupled to said first input and selectively coupled to said drain terminals to provide a programming current for said reference cells.

13. The integrated circuit of claim 12, further comprising a current mirror circuit configured to provide said programming current to selected bit lines of said memory array during programming of memory cells in said memory array.

14. The integrated circuit of claim 12, further comprising switching means for selectively coupling said drain terminals to said first input and said current source.

15. The integrated circuit of claim 11, wherein said comparator is an operational amplifier.

16. A memory circuit comprising:
    a memory array having a plurality of floating gate memory cells disposed in a first and second row and at least a first and second column; and
    means for providing a word line voltage for programming selected memory cells from a selected one of said first and second rows, said word line voltage dependent at least in part upon a bit line reference voltage selected for programming cells in a column of said memory array and upon a threshold voltage of memory cells from said selected one of said first and second rows.

17. The memory circuit of claim 16, wherein said providing means includes a first and second reference floating gate cells associated with said first and second rows, respectively, said providing means including means for fixing a voltage at a drain terminal of a selected reference cell to said bit line reference voltage.

18. The memory circuit of claim 17, further comprising programming current source means for providing a constant programming current for said reference cells and switching means for selectively coupling respective drain terminals of said reference cells to said a programming current source means.

19. The memory circuit of claim 17, further comprising means for providing said constant programming current to selected bit lines of said memory array during programming of said memory cells in said memory array.

* * * * *

UNITED STATES PATENT AND TRADEMARK OFFICE
CERTIFICATE OF CORRECTION

PATENT NO. : 6,906,958 B2
APPLICATION NO. : 10/397574
DATED : June 14, 2005
INVENTOR(S) : Yue-Der Chih and Cheng-Hsiung Kuo It is certified that error appears in the above-identified patent and that said Letters Patent is hereby corrected as shown below:

Column 2, line 49, delete ":" and insert therefor --.--; and

Column 4, line33, delete "Vret" and insert therefor --Vref--.

Signed and Sealed this

Twenty-eighth Day of November, 2006

JON W. DUDAS
*Director of the United States Patent and Trademark Office*